Oct. 1, 1968 H. C. WRIGHT 3,404,305

THREE REGION SEMICONDUCTOR HAVING RECTIFYING JUNCTIONS OF DIFFERENT COMPOSITIONS SO THAT WAVELENGTH OF EMITTED RADIATION DEPENDS ON DIRECTION OF CURRENT FLOW

Filed Jan. 18, 1966

INVENTOR.
HUBERT C. WRIGHT
BY
Frank R. Trifari
AGENT

United States Patent Office 3,404,305
Patented Oct. 1, 1968

3,404,305
THREE REGION SEMICONDUCTOR HAVING RECTIFYING JUNCTIONS OF DIFFERENT COMPOSITIONS SO THAT WAVELENGTH OF EMITTED RADIATION DEPENDS ON DIRECTION OF CURRENT FLOW

Hubert Charles Wright, Redhill, Surrey, England, assignor to North American Philips Company Inc., New York, N.Y., a corporation of Delaware Filed Jan. 18, 1966, Ser. No. 542,705
Claims priority, application Great Britain, Jan. 18, 1965, 2,100/65
6 Claims. (Cl. 313—108)

ABSTRACT OF THE DISCLOSURE

A two-terminal semiconductor lamp comprising three regions alternating in conductivity type forming two rectifying junctions, which have soft electrical characteristics. The composition of the semiconductor at the two junctions is different. When a voltage of one polarity is applied, radiation at certain wavelengths occurs at one of the junctions. When a voltage of the opposite polarity is applied, radiation at different wavelengths occurs at the other junction.

The invention relates to semiconductor lamps.

Semiconductor lamps are known. Such lamps may comprise a p-type region and an n-type region and the p-n junction may be a homojunction or a heterojunction. When such a lamp is forward biassed radiation occurs due to recombination of injected minority carriers in or near the junction depletion region.

According to a first aspect of the invention a semiconductor lamp comprises a first region of one conductivity type forming a rectifying junction with each of two other regions, neither of which are of the one conductivity type, whereby with one of the junctions biassed in the forward direction radiation of one wavelength is emitted and with the other of the junctions biassed in the forward direction radiation of a different wavelength is emitted.

In practice, such a lamp may be a p-n-p device of gallium phosphide or gallium arsenide with which diffusion of normally-used acceptors is controllable and into which the acceptors diffuse comparatively rapidly.

The lamp may be of gallium phosphide having a common n-type region, for example, doped with tin, and two other regions one a p-type region of gallium phosphide more lightly doped with zinc and the other p-type region of gallium phosphide more heavily doped in growth with zinc and oxygen. As an alternative, one or both of the junctions may be heterojunctions.

Such a lamp may be used as an indicator to give visual indication of four different states, that is, by emission of only the one wavelength, by emission of only the other wavelength, by emission of both wavelengths simultaneously and by emission of the two wavelengths alternately. Thus, the four states may be indicated by red, green, steady green and red and alternating green and red emission.

According to a second aspect of the invention, a circuit arrangement comprises a semiconductor lamp according to the invention and means to apply a forward bias across either or both of the rectifying junctions whereby two radiations of different wavelengths may be produced.

According to a third aspect of the invention, a matrix comprises a plurality of semiconductor lamps according to the invention and a common connection to one of the two other regions of each lamp.

Figure 1:
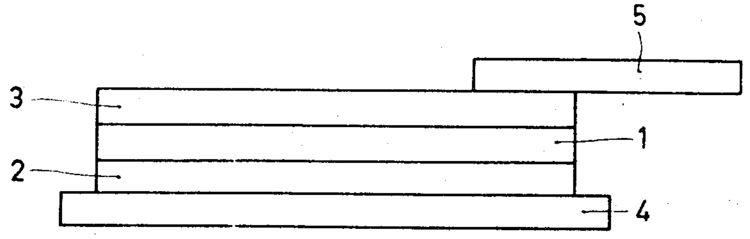

One example of a lamp according to the invention is shown in FIG. 1 of the accompanying diagrammatic drawing.

Figure 2:
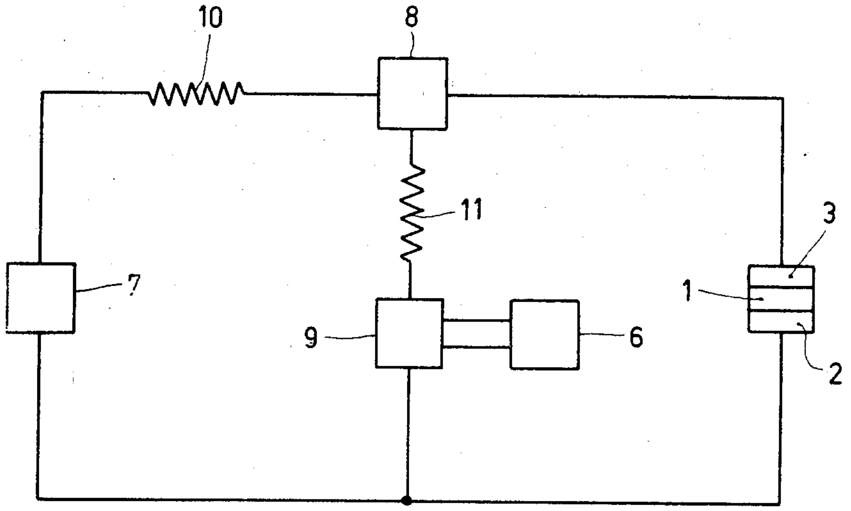

The lamp comprises an n-type region 1 of gallium phosphide and two p-type regions 2 and 3, also of gallium phosphide, porvided with connections 4 and 5 in the form of tabs of molybdenum or tantalum. The region 3 is of gallium phosphide grown in an oxygen atmosphere with a heavy doping of zinc. The region 1 is obtained from an epitaxial deposit formed on the zinc doped gallium phosphide and doped heavily with tin. After the removal of any unwanted deposit, the region 2 is obtained by deposition and alloying of a gold-zinc alloy (4% by weight of zinc). The tab 4 is provided with a coating of the gold-zinc alloy and secured to the region 2. The free surfaces of the region 3 and the tab 5 are provided with a coating of an aluminum zinc alloy (4% by weight of zinc) and the tab 5 is secured to the region 3. The lamp gives a red light when recombination is taking place at the junction 1, 3 and a green light when recombination is taking place at the junction 1, 2. FIG. 2 of the diagrammatic drawings shows the lamp of FIG. 1 connected in a circuit in which it can give red light, green light, or alternating green and red light. The circuit comprises a source 6 of direct voltage, a source 7 of alternating voltage, a switch 8 to connect either of the sources 6 and 7 and a switch 9 to connect the source 6 in either direction. The source 6 may have a voltage of ten volts and the source 7 may have a root mean square voltage of ten volts. Ballast resistors 10 and 11 are provided each of which may have a resistance of 100 ohms. The junctions pass current in the reverse direction so that a separate connection to the region 1 is unnecessary. In this connection, it is mentioned that the two p-n diodes are soft so that with either p-n junction reverse biassed and the other p-n junction forward biassed there is visible output at the other of the p-n junctions.

The lamp when connected in the manner shown in FIG. 2 may form part of a matrix of lamps providing a two-colour television image, in which case a common tab 4 may be provided in the form of a plate extending over the entire surface of the regions.

The dimensions of a single lamp may be 0.1 cm. x 0.1 cm. x 0.1 cm., the thicknesses of the regions 1, 2 and 3 being 50$\mu$, 5$\mu$ and 20$\mu$ respectively.

Now a second embodiment of a lamp according to the invention will be described.

The lamp comprises an n-type region 1 of gallium arsenide doped with tin and two p-type regions 2 and 3 of gallium arseno-phosphide and gallium-indium arsenide both doped with zinc. Connections 4 and 5 are made to the regions 2 and 3 by tabs of molybdenum or tantalum by way of gold-tin films.

The lamp may be made by two epitaxial depositions steps starting from a substrate body 1 of n-type gallium arsenide doped with $10^{17}$ atoms/cc. of tin which is available commercially and which may be made from an ingot drawn from an appropriate melt.

The p-type gallium arseno-phosphide region 2 is made by passing hydrogen through arsenic trichloride at 15° C. at a rate of 90 cc./min. and hydrogen through phosphorus trichloride at —35° C. at a rate of 10 cc./min. The gas streams are combined and pass over a boat containing gallium and zinc at 800° C. before reaching the prepared seed body 1 at 750° C. Deposition is continued for one hour so that a thickness of 30$\mu$ of gallium arseno-phosphide is provided.

Deposition occurs on all sides of the body 1 and, after masking, unwanted gallium arseno-phosphide is removed in about two minutes using an etchant consisting of three parts by volume of concentrated nitric acid, one part by volume of concentrated hydrofluoric acid and two parts by volume of water so that the deposited material is left on one of the major faces of the substrate body 1.

The other major face is then prepared for epitaxial deposition in known manner by a polishing etch of brominised methanol. The deposited material on the one major face of the body 1 and the sides of the body 1 are masked with deposited silicon oxide and the gallium-indium arsenide region 3 is made by passing hydrogen through arsenic trichloride at 15° C. at a rate of 100 cc./min. and passing the resultant gas stream over a boat containing 5 g. of gallium and 20 g. of indium doped with 30 mg. of zinc at 800° C. before reaching the prepared seed body 1 at 700° C. Deposition is continued for one hour so that a thickness of 30$\mu$ of gallium-indium arsenide doped with about $10^{18}$ atoms/cc. of zinc is provided.

The silicon oxide is removed, the contact films of gold 4% by weight of zinc 1000 A. thick are provided by evaporation in vacuo and the tabs 4 and 5 are affixed.

The lamp gives light having a wavelength of 8,000 A. in the infrared when recombination is taking place at the junction 1, 2 and light having a wavelength of 10,500 A. in the infrared when recombination is taking place at the junction 1, 3.

This last example makes clear that the light generated by the lamp may consist of invisible radiation, for instance infrared radiation, which may be detected by suitable radiation detectors, for instance infrared detectors.

A lamp according to the invention may be used in an opto-electronic device.

I claim:

1. A two-terminal semiconductor lamp comprising a semiconductor body including a first center region of one type conductivity and second and third regions on opposite sides of said first region, said second and third regions being of the opposite type conductivity forming with the first center region first and second rectifying junctions, respectively, a first terminal connection to the second region, a second terminal connection to the third region, means for applying a voltage of one polarity to the two terminals, and means for applying a voltage of the opposite polarity to the two terminals, the composition of the semiconductor body at the vicinity of the first junction being different from the composition at the vicinity of the second junction whereby when a voltage of one polarity is applied across the first and second terminals to bias the first junction in a forward direction and cause sufficient current flow through the body, radiation is emitted from the vicinity of said first junction at certain wavelengths, and when a voltage of the opposite polarity is applied across the first and second terminals to bias the second junction in a forward direction and cause sufficient current to flow through the body, radiation is emitted from the vicinity of the second junction at different wavelengths distinguishable from said certain wavelengths, said first and second rectifying junctions having soft electrical characteristics whereby with either junction reverse biased and the other junction forward biased, a visible or infrared radiation output is produced at said other junction.

2. A semiconductor lamp as set forth in claim 1 wherein the semiconductor body comprises a material selected from the group consisting of gallium phosphide and gallium arsenide.

3. A semiconductor lamp as set forth in claim 2 wherein the first region is n-type material doped with tin.

4. A semiconductor lamp as set forth in claim 3 wherein one of the second and third regions is lightly doped with zinc, and the other of the second and third regions is more heavily doped with zinc and oxygen.

5. A semiconductor lamp as set forth in claim 1 wherein one of the rectifying junctions is a heterojunction.

6. A lamp as set forth in claim 1 and further including means for applying an alternating current voltage to the two terminals.

References Cited

UNITED STATES PATENTS

| | | | |
|---|---|---|---|
| 3,267,294 | 8/1966 | Dumke et al. | 313—108 |
| 3,283,160 | 11/1966 | Levitt et al. | 313—108 |
| 3,309,553 | 3/1967 | Kroemer | 313—108 |
| 3,312,910 | 4/1967 | Offner | 313—108 |
| 3,330,991 | 7/1967 | Lavine et al. | 313—108 |
| 3,341,857 | 9/1967 | Kabell | 313—108 |
| 3,278,814 | 10/1966 | Rutz | 313—108 |
| 3,351,827 | 8/1965 | Newman | 317—235.48 |
| 3,351,828 | 11/1967 | Beale et al. | 317—235.27 |

ROBERT SEGAL, *Primary Examiner.*